United States Patent
Hite et al.

(10) Patent No.: US 8,530,742 B2
(45) Date of Patent: Sep. 10, 2013

(54) HOUSEHOLD APPLIANCE INCLUDING TWO-PIECE FASCIA PANEL AND METHOD OF MANUFACTURING THE TWO-PIECE FASCIA PANEL

(75) Inventors: David Hite, New Bern, NC (US); Michael Justis, New Bern, NC (US)

(73) Assignee: BSH Home Appliances Corporation, Irvine, CA (US)

( * ) Notice: Subject to any disclaimer, the term of this patent is extended or adjusted under 35 U.S.C. 154(b) by 296 days.

(21) Appl. No.: 12/947,848

(22) Filed: Nov. 17, 2010

(65) Prior Publication Data

US 2012/0118601 A1    May 17, 2012

(51) Int. Cl.
*H05K 5/00*    (2006.01)

(52) U.S. Cl.
USPC .............. 174/50; 174/66; 174/520; 220/3.2; 220/3.8; 220/241; 200/296

(58) Field of Classification Search
USPC ........... 174/66, 67, 50, 53, 57, 520; 220/241, 220/242, 3.2, 3.9, 4.02; 436/536, 535; 361/679.01, 679.02, 679.3; 200/296, 297, 200/341, 5 R, 302.1
See application file for complete search history.

(56) References Cited

U.S. PATENT DOCUMENTS

| | | | |
|---|---|---|---|
| 3,619,475 A * | 11/1971 | Bailey | 174/66 |
| 4,288,133 A | 9/1981 | Deatherage | |
| 5,138,527 A * | 8/1992 | Jones | 174/67 |
| 5,453,586 A * | 9/1995 | Stottmann | 200/5 R |
| 6,010,169 A | 1/2000 | Cox et al. | |
| 6,204,459 B1 * | 3/2001 | Kizele et al. | 200/302.1 |
| 6,872,345 B1 | 3/2005 | Yustick | |
| 7,014,281 B2 | 3/2006 | Wuestefeld et al. | |
| 7,399,027 B2 | 7/2008 | Woodhouse et al. | |
| 7,481,487 B2 | 1/2009 | Lau et al. | |
| 7,968,795 B2 * | 6/2011 | Yang | 174/67 |
| 8,049,121 B2 * | 11/2011 | Kleinlein et al. | 200/296 |
| 8,178,802 B2 * | 5/2012 | Roose et al. | 200/296 |
| 2010/0025214 A1 | 2/2010 | Roose et al. | |

* cited by examiner

*Primary Examiner* — Angel R Estrada

(74) *Attorney, Agent, or Firm* — James E. Howard; Andre Pallapies

(57) ABSTRACT

A household appliance having at least one fascia panel. In an exemplary embodiment, the at least one fascia panel may include an electronics housing structured to house electronic components for operating the household appliance, and a cosmetic panel structured to be at least one of mounted and joined with the electronics housing. The cosmetic panel may include one or more interfaces cooperating with the electronic components for operating the dishwasher.

20 Claims, 3 Drawing Sheets

HOUSEHOLD APPLIANCE INCLUDING TWO-PIECE FASCIA PANEL AND METHOD OF MANUFACTURING THE TWO-PIECE FASCIA PANEL

BACKGROUND OF THE INVENTION

1. Field of the Invention

The present invention relates to a household appliance and, more particularly, to a household appliance including a two-piece fascia panel, and a method of manufacturing the two-piece fascia panel.

2. Related Art

In a related art household appliance, such as a dishwasher, fascia panels are designed with cosmetic and structural features on one piece or component. A one-component fascia panel may be secured to a door of the household appliance, and may include a variety of switches, buttons, and other controls used to operate the household appliance.

In this one-component fascia panel design, the injection molding process used to manufacture the fascia panels becomes more critical. In particular, material flow and gating cannot be optimized for both cosmetic and structural features that are required of these fascia panels. Furthermore, the gating location during an injection molding process does not allow for molding technologies such as metallic acrylonitrile-butadiene-styrene (ABS) or use of other metallic materials or In-Mold Decorating, for example. A one-component fascia panel design also increases complexity and costs in the manufacturing process, particularly in tool complexity.

Further, because at least a portion of the one-component fascia panel is exposed to and used by a consumer, cosmetic appearance becomes important and, therefore, higher cost materials as well as increasingly complex molding processes are used for making the one-component fascia panel. Additionally, because of the one-component design, an entire fascia panel is required to be switched out or replaced if a consumer would like a different cosmetic appearance.

The present invention overcomes the problems associated with the related art by introducing a fascia panel with a cosmetic portion and an electronics housing designed as two separate components that when joined or attached, form the fascia panel.

SUMMARY OF THE INVENTION

A first aspect of the present invention is directed to a household appliance having at least one fascia panel. In an exemplary embodiment, the at least one fascia panel may include an electronics housing structured to house electronic components for operating the household appliance, and a cosmetic panel structured to be at least one of mounted and joined with the electronics housing. The cosmetic panel may include one or more interfaces cooperating with the electronic components for operating the dishwasher.

A second aspect of the present invention is directed to a fascia panel that is operable to be used with any number of electrical/electronic devices in addition to household appliances. The fascia panel may include an electronics housing structured to house electronic components for operating a device, and a cosmetic panel structured to be at least one of mounted and joined with the electronics housing. The cosmetic panel may include one or more interfaces cooperating with the electronic components for operating the device.

A third aspect of the present invention is directed to a method of manufacturing a fascia panel. In an exemplary embodiment, the method may include molding and solidifying an electronics housing structured to house electronic components for operating a device; separately molding and solidifying a cosmetic panel, the cosmetic panel including one or more interfaces cooperating with the electronic components for operating the device; and at least one of mounting and joining the cosmetic panel with the electronics housing subsequent to their respective solidifying steps.

The illustrative aspects of the present invention are designed to solve the problems herein described and other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various exemplary embodiments of the disclosure, in which.

Figure 1:
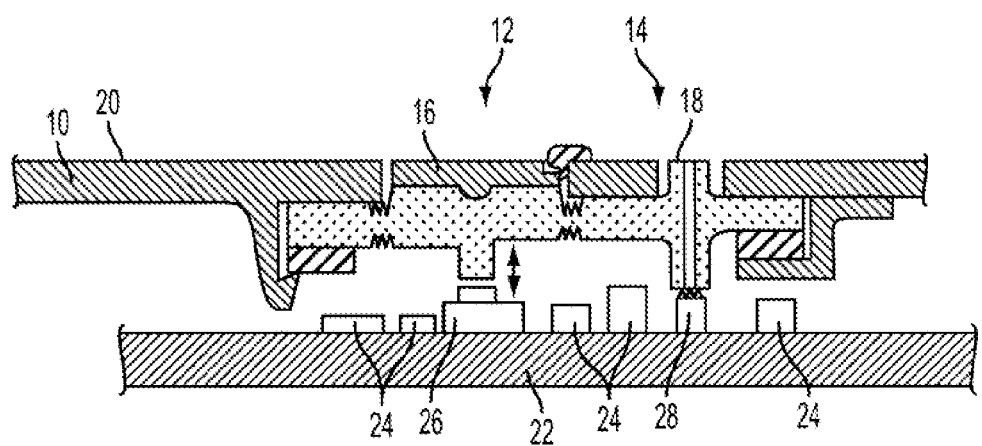
FIG. 1 depicts a household appliance and a fascia panel thereof according to an exemplary embodiment of the invention.

The drawings are merely schematic representations and not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

FIG. 1 shows an exemplary embodiment of a household appliance and a fascia panel thereof according to an exemplary embodiment of the invention. In FIG. 1, an externally accessible fascia panel 10 of a control unit of a domestic appliance, such as a dishwasher, may include a number of panel interfaces, openings, printing, etc. In FIG. 1, two panel openings 12, 14 have been cut. The one panel opening 12 may serve, for example, as a mounting for a control button 16 while the other panel opening 14 may be provided as a mounting for an indicator 18. As shown in FIG. 1, both the control button 16 and the indicator 18 may be approximately level or flat with the front face 20 of the fascia panel 10 at the front.

Furthermore, the fascia panel 10 may include a control board 22 arranged at a distance behind the fascia panel 10 that is used for mounting or holding electrical and/or electronic components 24, 26, 28, for control of the household appliance. The individual components 24, 26, 28 may furthermore be preferably connected to each other via the board 22. It would, of course, be equally conceivable for the components 24, 26, 28 to be connected to each other or to other components by means of separately routed leads. It can also be seen from FIG. 1 that the components 24, 26, 28 are arranged on the front 30 of the board 22 facing the front of the fascia panel 10.

While not depicted in FIG. 1, the physical structure of the household appliance or device of the present invention outside of the novel fascia panel herein may be any household appliance or device structure known in the related art.

Figure 2A:
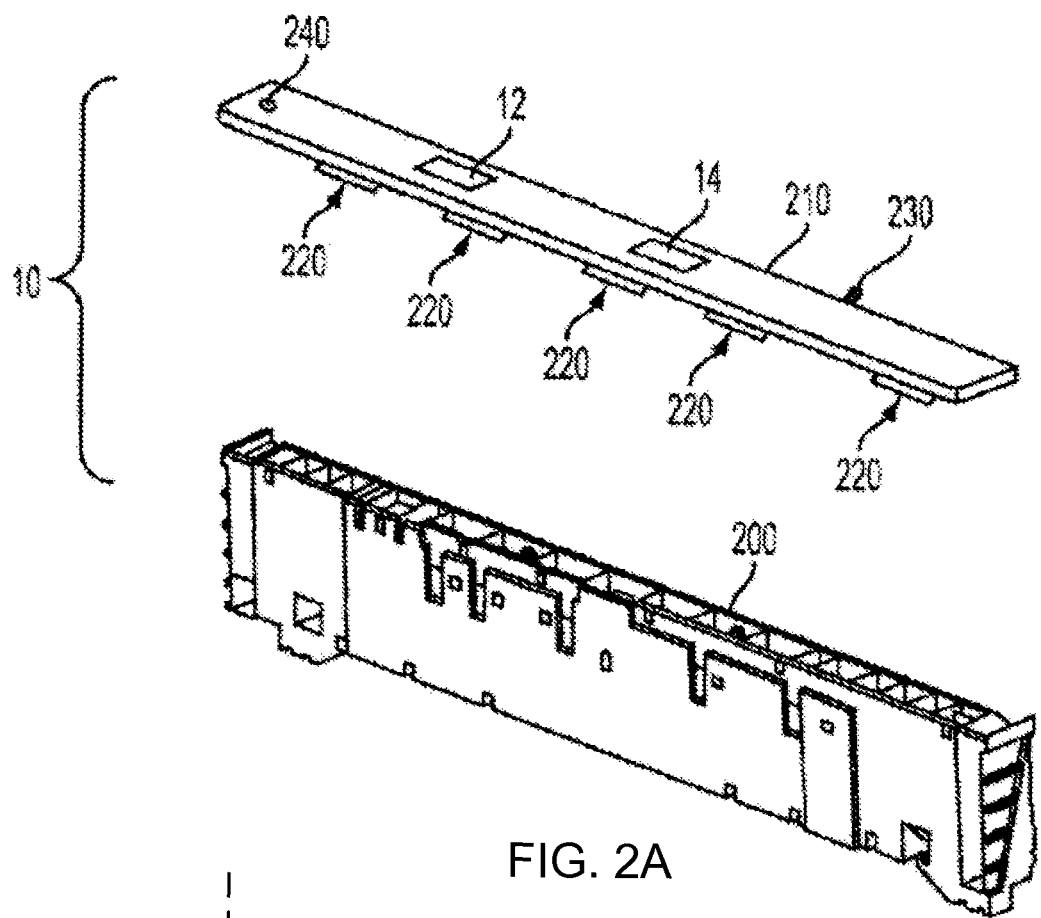
FIGS. 2A and 2B depict a fascia panel having a cosmetic panel structured to be at least one of mounted and joined with an electronics housing according to an exemplary embodiment of the invention.
Figure 2B:
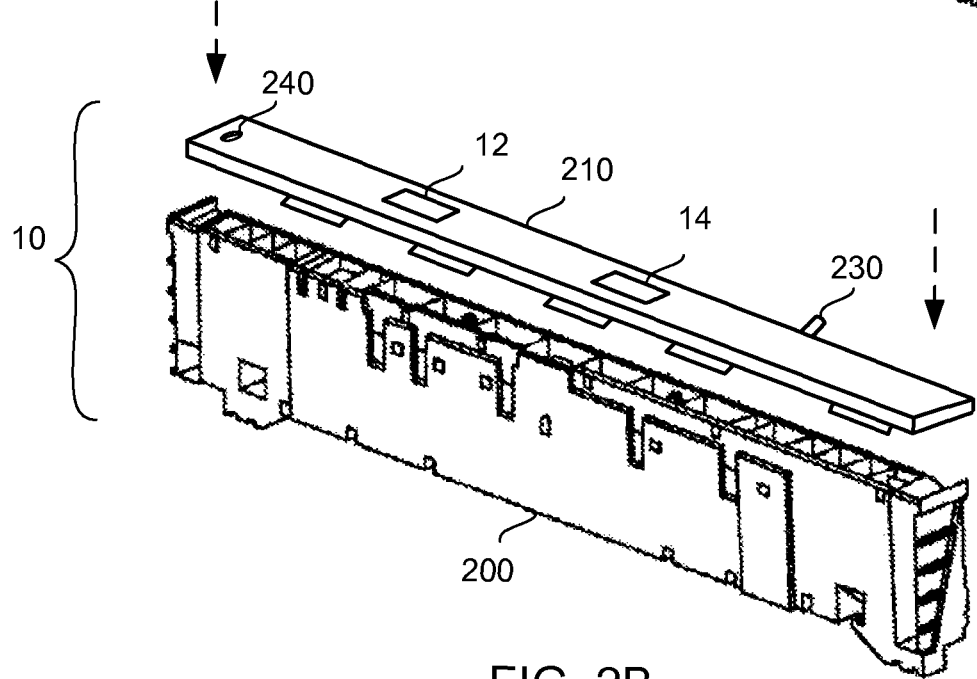

As shown in FIGS. 2A and 2B, the fascia panel 10 may include an electronics housing 200 structured to house electronic components 24, 26, 28 for operating the household appliance, and a cosmetic panel 210 structured to be at least one of mounted and joined with the electronics housing 200. As noted above, the cosmetic panel 210 may include one or more interfaces or openings 12, 14 cooperating with the electronic components 24, 26, 28 for operating the household appliance.

The cosmetic panel 210 may include one or more hook components 220, wherein the cosmetic panel 210 may be mounted to the electronics housing 200 by the one or more hook components 220. The one or more hook components 220 may be placed in interference to the electronics housing to eliminate any gaps between the cosmetic panel 210 and the electronics housing 200. Of course, while hook components 220 may be shown in the illustrative embodiment of FIG. 2, one of ordinary skill in the art would understand that other methods of joining or attaching the cosmetic panel 210 to the electronics housing 200 are not precluded, such as using welding, epoxy techniques, and/or connector arrangements such as a male-female connector arrangement.

Further, the cosmetic panel 210 may include one or more gate locations 230 operable to be used with at least one of metallic acrylonitrile-butadiene-styrene (ABS) and In-Mold Decorating molding processes. It should be noted that the injection molding of the cosmetic panel 210, since it is performed separately from the injection molding of the electronics housing 200, may use these advanced molding processes. Of course, other molding processes known in the art are not precluded.

The fascia panel 10 may be attached to a door (not shown) of the household appliance using one or more screws 240. In this manner, the cosmetic panel 210 may be structured to use the screws 240 for alignment with the door.

Figure 3:
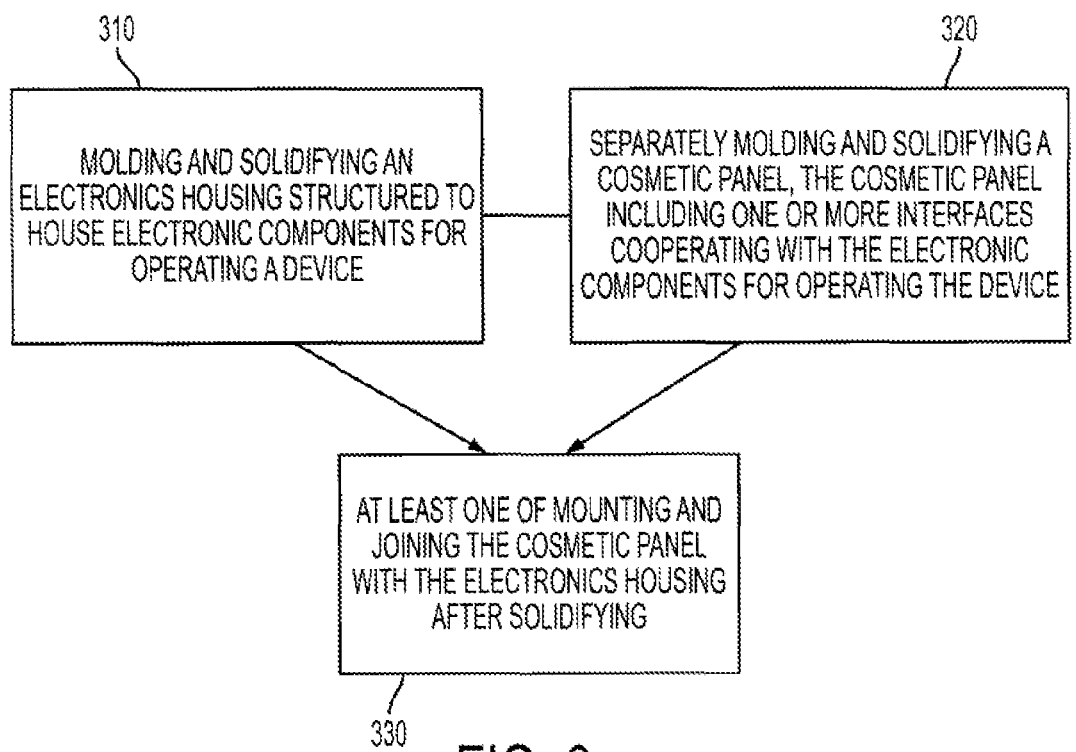
FIG. 3 depicts a method of manufacturing a fascia panel according to an exemplary embodiment of the invention.

FIG. 3 depicts a method of manufacturing a fascia panel according to an exemplary embodiment of the invention. In a separate molding process, an electronics housing and a cosmetic panel are molded and solidified. In particular, in step 310, the electronics housing structured to house electronic components for operating a device, such as a dishwasher, is molded and solidified.

In step 320, which may be performed concurrently or at different times than the molding process in step 310, the cosmetic panel including one or more interfaces cooperating with the electronic components for operating the device is molded and solidified. Then, in step 330, the cosmetic panel and the electronics housing are mounted and/or joined subsequent to their respective solidifying steps.

It should be noted that the injection molding of the cosmetic panel, since it is performed separately from the injection molding of the electronics housing, may use advanced molding processes such as metallic acrylonitrile-butadiene-styrene (ABS) and In-Mold Decorating molding processes. In the related art one-component fascia panel, the gating location does not allow for these molding processes.

Additionally, since the electronics housing is not exposed to the consumer, a lower cost material may be used than that of the cosmetic panel, thereby lowering manufacturing costs.

During the molding and solidifying of the cosmetic panel, one or more hook components may be provided, wherein the cosmetic panel may be mounted in interference to the electronics housing the one or more hook components to eliminate a gap between the cosmetic panel and the electronics housing. Of course, the hook components may be added to the cosmetic panel after injection molding by other known manufacturing methods. Further, the cosmetic panel and the electronics housing may be joined by other techniques, such as welding, bonding, and/or connector methods such as using a male-female connector arrangement.

The method of the invention allows for an improved cosmetic of the surfaces of the fascia panel due to optimized injection moldability. Also, the invention allows for variant interchangeability due to scenarios where the electronics housing and multiple cosmetic components may be interchanged. Additionally, the method allows for simplified and lower cost packaging due to a smaller, less complicated cosmetic component. Further, there is an improved quality for the cosmetic component due to not having to work or handle the electronics housing together.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A household appliance having at least one fascia panel, the at least one fascia panel comprising:
   an electronics housing structured to house electronic components for operating the household appliance; and
   a cosmetic panel formed separately from the electronics housing and including one or more gate locations along an edge of the cosmetic panel,
   the one or more gate locations configured for use with at least one of metallic acrylonitrile-butadiene-styrene (ABS) and In-Mold Decorating molding processes,
   the cosmetic panel structured to be at least one of mounted and joined with the electronics housing and forming an outer surface of the fascia panel, and
   the cosmetic panel including one or more interfaces cooperating with the electronic components for operating the dishwasher.

2. The household appliance of claim 1, wherein the cosmetic panel includes one or more hook components, and
   wherein the cosmetic panel is mounted to the electronics housing by the one or more hook components.

3. The household appliance of claim 2, wherein the one or more hooks are structured in interference to the electronics housing to eliminate a gap between the cosmetic panel and the electronics housing.

4. The household appliance of claim 1, wherein the cosmetic panel is joined to the electronics housing at least one of a weld, epoxy, and a male-female connector arrangement.

5. The household appliance of claim 1, wherein the one or more interfaces are openings cooperating with at least one of a button and light guide of the electronic components.

6. The household appliance of claim 1, wherein the at least one fascia panel is structured to be attached to a door of the household appliance using one or more screws.

7. The household appliance of claim 6, wherein the cosmetic panel is structured to use the screws for alignment with the door.

8. The household appliance of claim 1, wherein the cosmetic panel includes one or more hook components extending from a second edge of the cosmetic panel, the cosmetic panel being mounted to the electronics housing by the one or more hook components.

9. A fascia panel, comprising:
   an electronics housing structured to house electronic components for operating a device; and
   a cosmetic panel formed separately from the electronics housing and including one or more gate locations along an edge of the cosmetic panel,
   the one or more gate locations configured for use with at least one of metallic acrylonitrile-butadiene-styrene (ABS) and In-Mold Decorating molding processes, the cosmetic panel structured to be at least one of mounted and joined with the electronics housing and forming an outer surface of the fascia panel, and the cosmetic panel including one or more interfaces cooperating with the electronic components for operating the device.

10. The fascia panel of claim 9, wherein the cosmetic panel includes one or more hook components, and
wherein the cosmetic panel is mounted to the electronics housing by the one or more hook components.

11. The fascia panel of claim 10, wherein the one or more hooks are structured in interference to the electronics housing to eliminate a gap between the cosmetic panel and the electronics housing.

12. The fascia panel of claim 9, wherein the cosmetic panel is joined to the electronics housing at least one of a weld, epoxy, and a male-female connector arrangement.

13. The fascia panel of claim 9, wherein the one or more interfaces are openings cooperating with at least one of a button and light guide of the electronic components.

14. The fascia panel of claim 9, wherein the fascia panel is structured to be attached to a door of the device using one or more screws.

15. The fascia panel of claim 14, wherein the cosmetic panel is structured to use the screws for alignment with the door.

16. The fascia panel of claim 9, wherein the cosmetic panel includes one or more hook components extending from a second edge of the cosmetic panel, the cosmetic panel being mounted to the electronics housing by the one or more hook components.

17. A method of manufacturing a fascia panel of a household appliance, the fascia panel including an electronics housing structured to house electronic components for operating a device, and a cosmetic panel formed separately from the electronics housing and including one or more gate locations along an edge of the cosmetic panel, the one or more gate locations configured for use with at least one of metallic acrylonitrile-butadiene-styrene (ABS) and In-Mold Decorating molding processes, the cosmetic panel structured to be at least one of mounted and joined with the electronics housing and forming an outer surface of the fascia panel, and the cosmetic panel including one or more interfaces cooperating with the electronic components for operating the device, the method comprising:
molding and solidifying the electronics housing structured to house the electronic components for operating the device;
separately molding and solidifying the cosmetic panel, wherein the cosmetic panel is separately molded using the at least one of metallic acrylonitrile-butadiene-styrene (ABS) and In-Mold Decorating molding processes and the one or more gate locations along an edge of the cosmetic panel,
the cosmetic panel including the one or more interfaces cooperating with the electronic components for operating the device; and
at least one of mounting and joining the cosmetic panel with the electronics housing subsequent to their respective solidifying steps.

18. The method of claim 17, wherein the injection molding of the cosmetic panel uses at least one of metallic acrylonitrile-butadiene-styrene (ABS) and In-Mold Decorating molding process.

19. The method of claim 17, wherein the molding of the electronics housing is performed using a lower cost material than the injection molding of the cosmetic panel.

20. The method of claim 17, wherein the molding and solidifying of the cosmetic panel provides one or more hook components, and wherein the cosmetic panel is mounted in interference to the electronics housing to eliminate a gap between the cosmetic panel and the electronics housing.

* * * * *